(12) United States Patent
Sasaki et al.

(10) Patent No.: US 8,207,513 B2
(45) Date of Patent: Jun. 26, 2012

(54) CHARGED PARTICLE BEAM APPARATUS

(75) Inventors: Yuko Sasaki, Mito (JP); Yasuhiro Gunji, Hitachiota (JP); Zhaohui Cheng, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 128 days.

(21) Appl. No.: 12/615,955

(22) Filed: Nov. 10, 2009

(65) Prior Publication Data

US 2010/0051806 A1    Mar. 4, 2010

Related U.S. Application Data (63) Continuation of application No. 11/311,278, filed on Dec. 20, 2005, now abandoned.

(30) Foreign Application Priority Data

Dec. 20, 2004    (JP) .................................. 2004-367153

(51) Int. Cl.
*G21K 5/10*    (2006.01)
(52) U.S. Cl. ............. 250/492.22; 250/492.1; 250/492.2; 250/492.3
(58) Field of Classification Search ............. 250/396 R, 250/396 ML, 306, 307, 310, 311, 492.1, 250/492.3
See application file for complete search history.

(56) References Cited

U.S. PATENT DOCUMENTS

| | | | |
|---|---|---|---|
| 4,066,863 A * | 1/1978 | Doran et al. ............. | 219/121.28 |
| 4,763,004 A * | 8/1988 | Yasuda et al. ............. | 250/396 R |
| 6,027,841 A * | 2/2000 | Suzuki ............................ | 430/30 |
| 6,087,673 A | 7/2000 | Shishido et al. | |
| 6,348,690 B1 | 2/2002 | Iwabuchi et al. | |
| 6,509,564 B1 | 1/2003 | Suzuki et al. | |
| 6,538,249 B1 * | 3/2003 | Takane et al. ..................... | 850/9 |
| 6,734,437 B2 | 5/2004 | Norioka et al. | |
| 6,987,265 B2 | 1/2006 | Iwabuchi et al. | |
| 6,992,290 B2 | 1/2006 | Watanabe et al. | |
| 7,049,611 B2 * | 5/2006 | Komagata ................ | 250/492.23 |
| 2004/0222376 A1 * | 11/2004 | Sasaki et al. .................. | 250/310 |
| 2005/0099628 A1 | 5/2005 | Kokumai | |
| 2005/0116180 A1 * | 6/2005 | Komagata .................. | 250/492.1 |

FOREIGN PATENT DOCUMENTS

| | | |
|---|---|---|
| JP | 51-011574 | 1/1976 |
| JP | 08-195345 | 7/1996 |
| JP | 10-318950 | 12/1998 |

(Continued)

OTHER PUBLICATIONS

Japanese Office Action, with English translation, issued in Japanese Patent Application No. 2004-367153, mailed May 12, 2009.

*Primary Examiner* — Michael Maskell
(74) *Attorney, Agent, or Firm* — McDermott Will & Emery LLP (57) ABSTRACT

A charged particle beam apparatus is provided which has high resolving power and a wide scanning region (observation field of view). The apparatus has a unit for adjusting the focus, a unit for adjusting astigmatism, a unit for controlling and detecting scanning positions and a controller operative to control the focus adjustment and astigmatism adjustment at a time in interlocked relation to the scanning positions, thereby assuring compatibility between the high resolving power and the observation view field of a wide area.

8 Claims, 10 Drawing Sheets

FOREIGN PATENT DOCUMENTS

| | | |
|---|---|---|
| JP | 11-051886 | 2/1999 |
| JP | 2000-040481 | 2/2000 |
| JP | 2001-068048 | 3/2001 |
| JP | 2002-184336 | 6/2002 |
| JP | 2004-158366 | 6/2004 |
| WO | WO 02/49066 A1 | 6/2002 |

* cited by examiner

CHARGED PARTICLE BEAM APPARATUS

CROSS-REFERENCE TO RELATED APPLICATIONS

This application is a Continuation of U.S. application Ser. No. 11/311,278, filed on Dec. 20, 2005 now abandoned, claiming priority of Japanese Patent Application No. 2004-367153, filed on Dec. 20, 2004, the entire contents of each of which are hereby incorporated by reference.

BACKGROUND OF THE INVENTION

The present invention relates to a charged particle beam apparatus for performing highly accurate inspection, measurement and working by using a charged particle beam.

Available as a charged particle beam apparatus are a scanning electron microscope (hereinafter referred to as SEM) and an electron microscope for length measurement, simply, a measuring electron microscope (hereinafter referred to as CD-SEM) representing one of apparatus for inspection of semiconductor specimens. In addition, as described in JP-A-11-51886, an inspection apparatus is available which uses image comparison to thoroughly inspect the overall region to find where a defect exists on a wafer. There are a variety of inspection target objects involved in the inspection apparatus, including not only defective shapes in patterns but also conduction/non-conduction defects and deposition of foreign matters.

Desirability of customers for need for an image of higher resolving power and minute or fine formation of a semiconductor pattern prevails, followed by advancement of high resolution powering of the aforementioned apparatus, and there results a tendency to shorten the distance between an objective lens and a specimen. In other words, for the sake of high resolution powering, the focal point of the objective lens becomes shorter to ensure that a charged particle beam can be reduced in aberration and an image of high resolving power can be acquired. In the SEM, however, a field of view is searched with an observed image of a wide region (low magnification image) and hence there arises a problem that an image at a magnification suitable for view field search cannot be obtained. In the inspection apparatus, the above situation also gives rise to a causative factor of prevention of improvements in inspection speed. As described in the aforementioned JP-A-11-51886, with the aim of improving the throughput, a method is employed according to which a specimen stage is continuously moved while scanning an electron beam to acquire an image but with more improvements in throughput desired, it is necessarily inevitable to adopt a method of inspecting a wide region at once. But because of the shortened focal point, a problem is encountered in which when a wide region is scanned/irradiated with a charged particle beam, blur and distortion are caused at the peripheral portion. Therefore, the region of an image suitable for inspection is limited to that devoid of blur and distortion and the high resolution powering causes a reduction in throughput to incur.

In case an image is formed by an information signal and a line width of a pattern is measured or in the case of a comparative inspection for detecting a defect by comparing pattern images, the quality of an obtained image has the great influence upon the reliability of inspection results. Since the quality of an image is deteriorated owing to aberration of an electron optical system and to degraded image resolution caused by blur, the sensitivity of inspection of defects and the performance of measurement are degraded in the case of an image having blur and distortion at the peripheral portion under scanning/irradiation of a wide region. JP-A-10-318950 describes a method of assuring a view field of a wide region by detecting a positional shift through correction of the distortion to form an image devoid of distortion.

Figure 2:
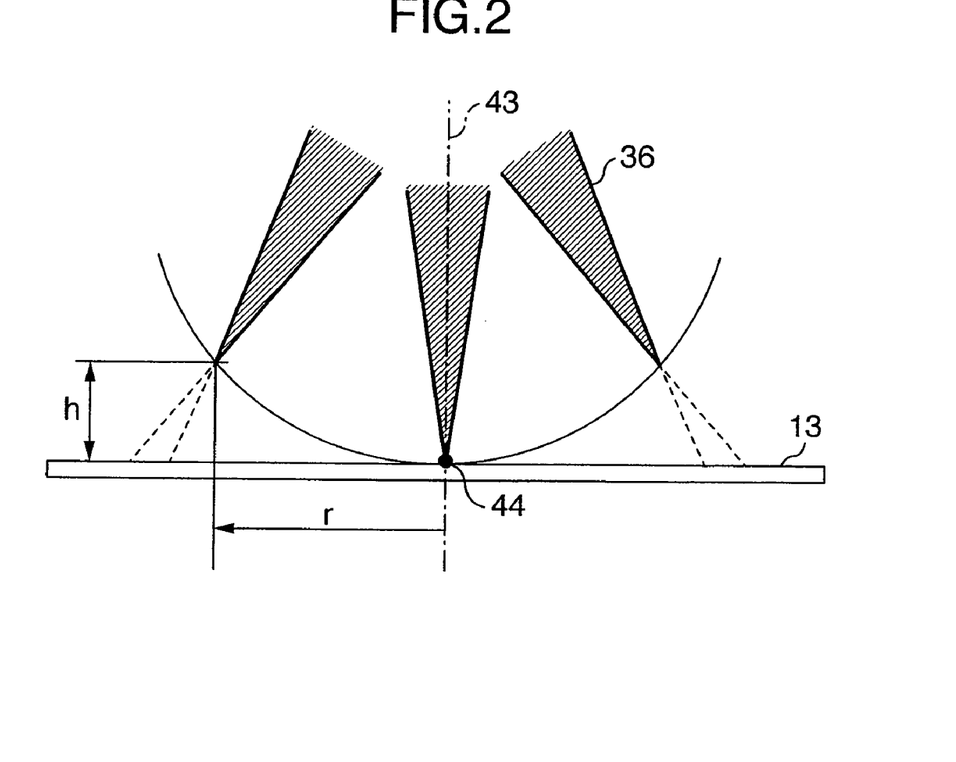
FIG. 2 is a diagram showing a locus of a charged particle beam near a specimen.

Usually, adjustment of focus and astigmatism is made while watching an image formed by an information signal but mostly, watching is directed to only the central portion of a region scanned with a charged particle beam. Exaggeratedly illustrated in FIG. 2 is the behavior of a charged particle beam near the surface of a specimen. The charged particle beam, as designated at 36, scans the specimen surface while tracing an arcuate locus like a pendulum about the center lying at an intersection 44 where an optical axis 43 crosses orthogonally a specimen 13 and actually, as the charged particle beam proceeds by width r, the height changes by h as shown in FIG. 2. The change h in height results in a shift of focal position of the charged particle beam, leading to an image field curvature aberration on the specimen responsible for blur, as shown at dotted line. Further, as the charged particle beam deviates from the optical axis, an astigmatic aberration also takes place. JP-A-2001-68048 discloses a method for automatic adjustment of astigmatism. And also, in scanning a wide region, the magnetic field and electric field of a deflector becomes irregular towards the peripheral portion and distortion takes place. The shorter the focus of the objective lens, the more the distortion becomes noticeable, indicating that as the high resolution powering advances, the limit of the scanning region tends to be narrowed. Conventionally, the scanning region is limited to a range within which any blur and distortion do not take place or they are permissible, thereby defining a maximum observation view field or a maximum inspection region.

SUMMARY OF THE INVENTION

Figure 3:
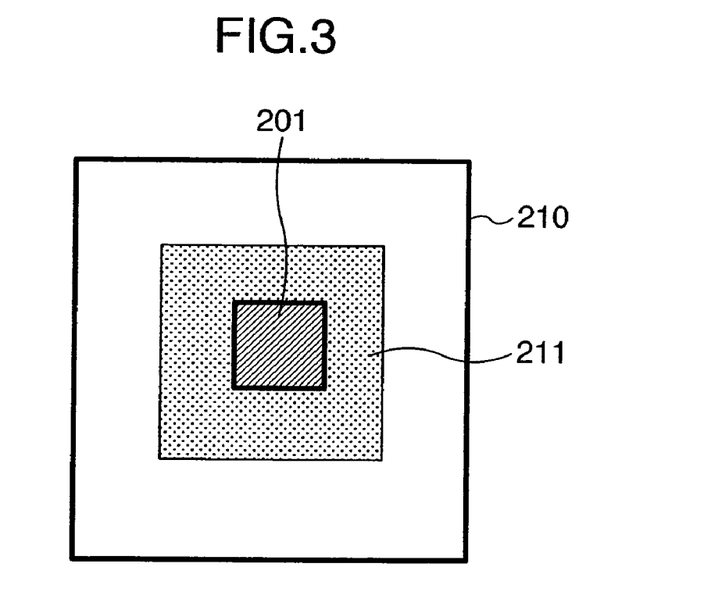
FIG. 3 is a diagram useful to explain a scanning region.

As exemplified in FIG. 3, a scanning range of a charged particle beam suitable for search of the view field or a scanning range determined from the standpoint of throughput is assumed to be as a scanning region 210. Then, it is presupposed that focus and astigmatism are adjusted at a central area 201 and an area, in which the picture quality is substantially the same as that in the central area, that is, no blur exists or blur is permissible, is defined as area 211. This area 211 tends to be narrowed proportionately to shortening of the focus of the objective lens aiming at high resolution powering, giving rise to a problem that search of a field of view is difficult to achieve for a large specimen in the SEM and in the case of an inspection apparatus, the area usable for inspecting objects at a time is narrowed to degrade the throughput. Especially, when an inspection is conducted in a fabrication process of a semiconductor wafer and the like, a degradation of throughput is fatally unprofitable.

A first object of the present invention is to provide a charged particle beam apparatus having high resolving power and a wide scanning region (observation field of view).

A second object of the present invention is to provide a charged particle beam apparatus capable of speeding up inspection using a charged particle beam.

To accomplish the above objects, a charged particle beam apparatus according to this invention comprises means for adjusting focus, means for adjusting astigmatism, means for controlling/detecting a scanning position and means for simultaneously controlling the focus adjustment and the astigmatism adjustment in interlocked relation to the scanning position. The means as above can make the high resolution powering compatible with the assurance of the observation view field of a wide region, so that an image at a magnification suitable for search of the view field can be obtained and besides, the throughput can be improved in an inspection apparatus using a charged particle beam.

According to the present invention, a charged particle beam apparatus meeting high resolving power and wide scanning region (observation view field) can be realized and speedup of inspection can be achieved in an inspection apparatus using a charged particle beam.

Other objects, features and advantages of the invention will become apparent from the following description of the embodiments of the invention taken in conjunction with the accompanying drawings.

DESCRIPTION OF THE EMBODIMENTS

The present invention will now be described in greater detail by way of embodiments thereof.

Figure 1:
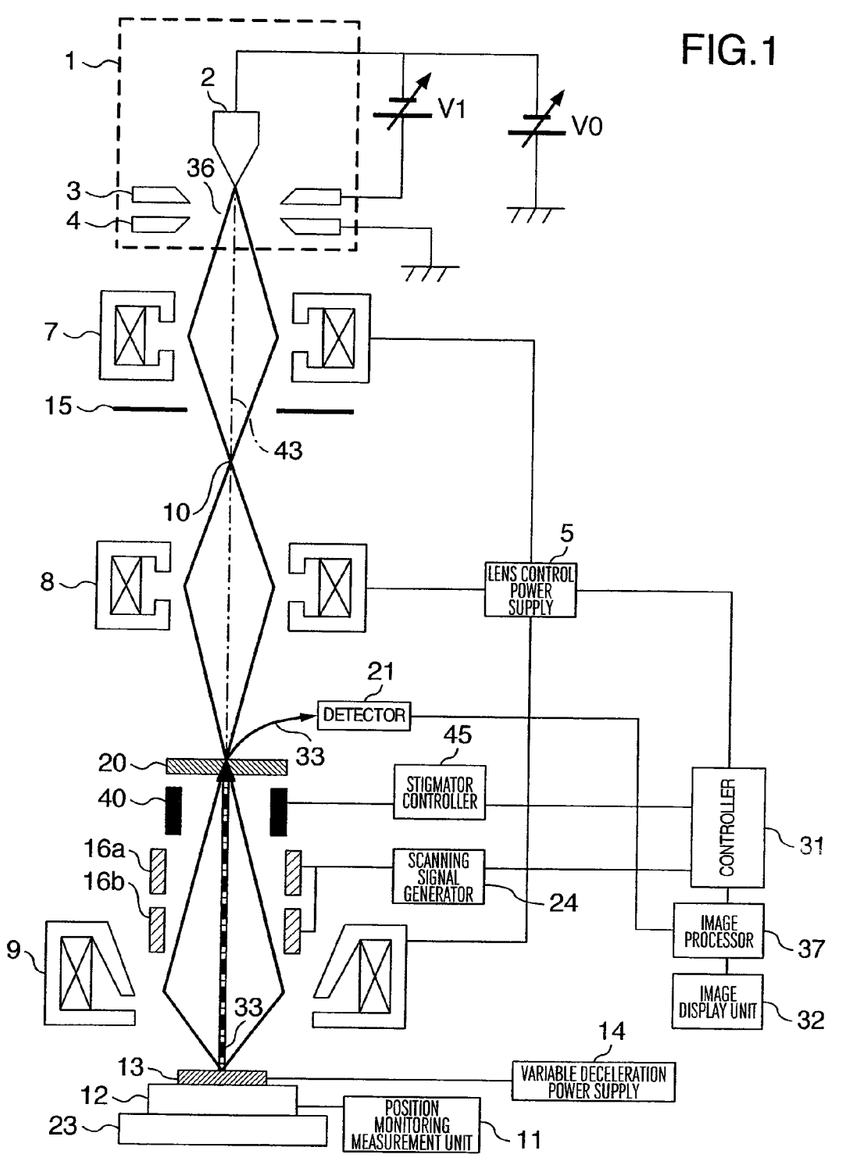
FIG. 1 is a schematic construction diagram showing an example of a charged particle beam apparatus according to the present invention.
Figure 4:
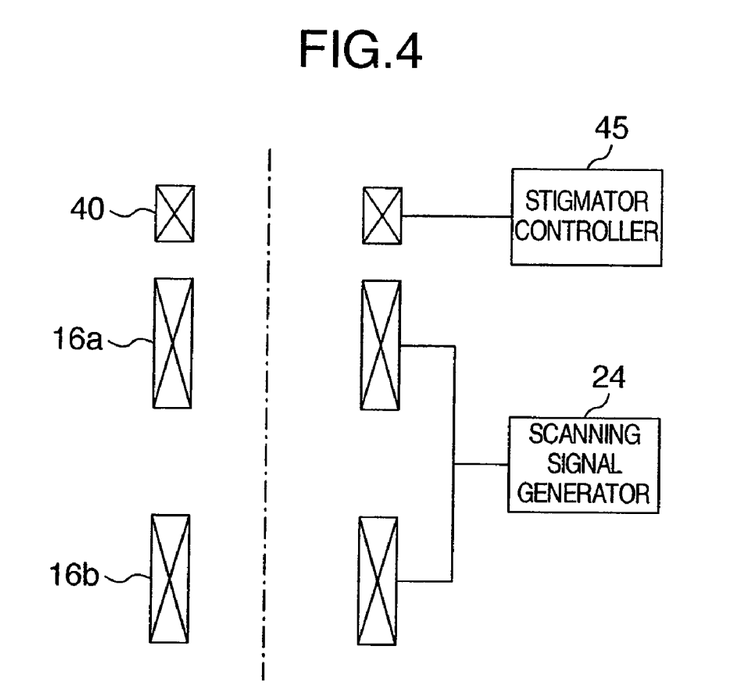
FIG. 4 is a diagram showing an example of structure when a deflector and a stigmator are of the electromagnetic type.

Referring first to FIG. 1, an example of construction of a charged particle beam apparatus according to the present invention is schematically illustrated. A charged particle gun 1 is comprised of a charged particle source 2, an extracting electrode 3 and an accelerating electrode 4. Extraction voltage V1 is applied across the charged particle source 2 and the extracting electrode 3 to thereby extract a primary charged particle beam 36 from the charged particle source 2. The accelerating electrode 4 is maintained at earth potential and accelerating voltage V0 is applied across the accelerating electrode 4 and the charged particle source 2. Accordingly, the primary charged particle beam 36 is accelerated by the accelerating voltage V0. The accelerated primary charged particle beam 36 is removed of an unnecessary region by means of an aperture 15, condensed by a condenser lens 7 connected to a lens control power supply 5 so as to be formed into a crossover 10 and then further condensed by a condenser lens 8. Thereafter, the beam is focused on a specimen 13 such as a semiconductor wafer on a specimen stage 12 by an objective lens 9. The specimen stage 12 is movable at least horizontally by means of a stage drive unit 23. The specimen 13 is irradiated with the focused primary charged particle beam 36 while the primary charged particle beam 36 being corrected for its astigmatism by means of a stigmator 40 adapted to correct astigmatic aberration and scanned by means of a deflector generally designated at 16 and having elements 16a and 16b connected to a scanning signal generator 24. In this phase, the stigmator 40 is controlled with a stigmator controller 45. When the deflector 16 and the stigmator 40 are of the electromagnetic type, they are structured as exemplified in FIG. 4. An information signal 33 generated from the specimen 13 under irradiation of the primary charged particle beam 36 is detected with a signal detector 21. The detected signal is converted into a brilliance modulation signal for an image display unit 32 such as a CRT so that a magnified image of the specimen may be displayed on the image display unit 32. Although not illustrated, the components put together as above are housed in a vacuum container suitable for illumination of the charged particle beam.

Focus and astigmatism are corrected on real time base in interlocked relation to scanning positions of the primary charged particle beam 36. The scanning position of the primary charged particle beam 36 is controlled with the scanning signal generator 24 and then a change in focus is corrected by the objective lens 9 and an astigmatic aberration is adjusted by the stigmator 40 in relation to a scanning position.

Figure 5:
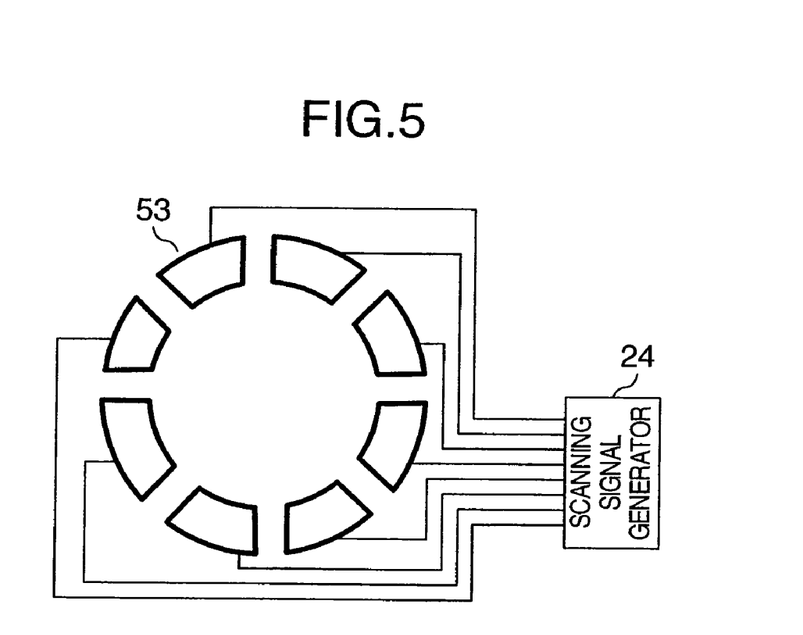
FIG. 5 is a diagram showing an example of a stigmator electrode.
Figure 6:
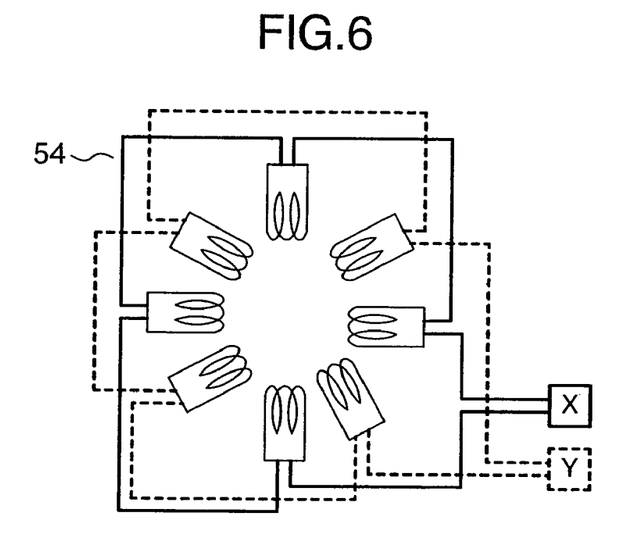
FIG. 6 is a diagram showing an example of a stigmator coil.
Figure 7:
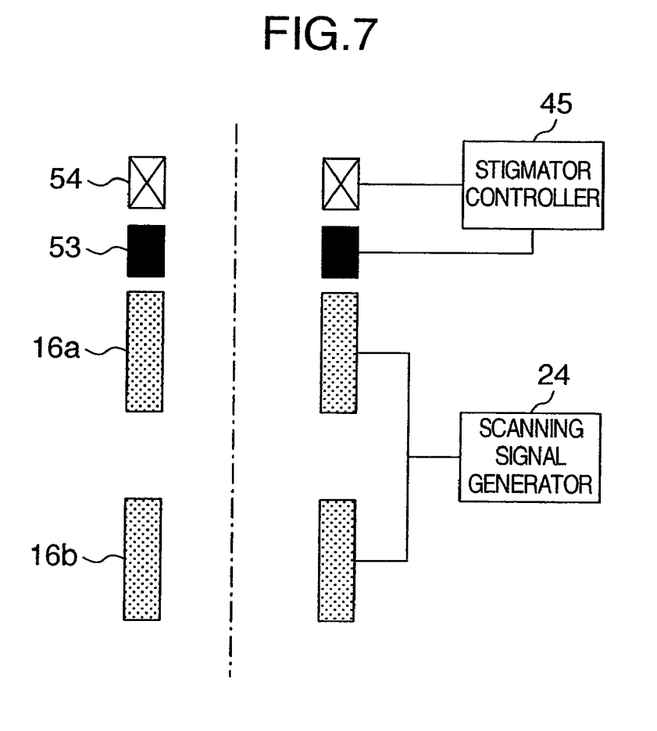
FIG. 7 is a diagram showing an example of structure of the stigmator coil and stigmator electrode used in combination.

In this case, the stigmator 40 can be constructed of a stigmator electrode 53 of plural segments for generating an electric field as shown in FIG. 5 or of a stigmator coil 54 of plural segments for generating a magnetic field as shown in FIG. 6. When the stigmator 40 is controlled in interlocked relation to the scanning position, the stigmator electrode 53 of FIG. 5 may preferably be used if the response rate or speed is taken into consideration. But control of the electrode is based on voltage control and a circuit to this end is difficult to construct. In comparison therewith, the stigmator coil 54 of FIG. 6 is inferior to the electrode type from the standpoint of the response rate but is meritorious in that it can be controlled easily with current values. In addition, because of the simplified structure of coil segments, the coil type can be made up more cheaply than the electrode type structure. For example, these types can be used properly such that the stigmator coil 54 is used for adjustment of astigmatism during usual image observation whereas the stigmator electrode 53 is used when an adjustment is made in interlocked relation to a scanning position. An example of structure for this purpose is illustrated in FIG. 7.

Figure 8:
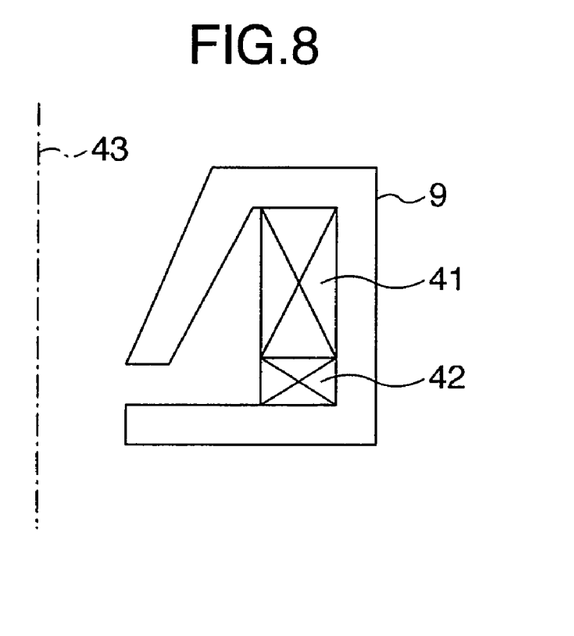
FIG. 8 is a diagram showing an example of structure of an objective lens.

The objective lens 9 can be formed of an electromagnetic objective lens for generating a magnetic field or an electrostatic objective lens for generating an electric field. Likewise, each of the condenser lenses 7 and 8 can be constructed of a magnetic lens or an electrostatic lens. Furthermore, in case the objective lens 9 is, for example, an electromagnetic objective lens, a second coil 42 for focus correction may also be provided separately as shown in FIG. 8. For example, a first coil 41 serving as a main part is set with an exciting current obtained when an adjustment is made at the optical axis center position 44 and the second coil 42 is used to correct changes in focus.

Figure 9:
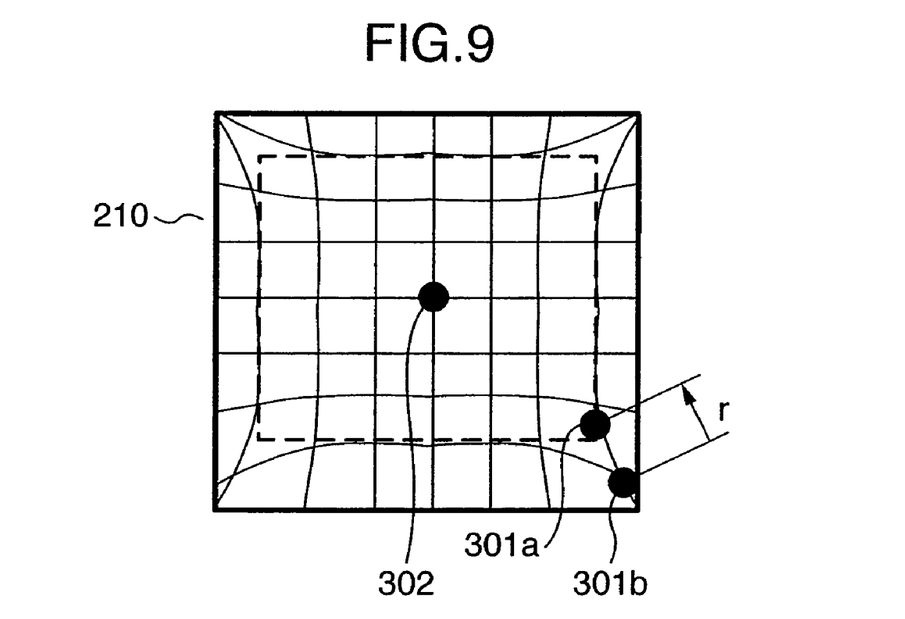
FIG. 9 is a diagram for explaining distortion inside a field of view.

And also, at the peripheral portion of a scanning region, the magnetic field or electric field of the deflector 16 becomes irregular and a distortion takes place. An example of the distortion is shown in FIG. 9. For example, when a mesh-like object is observed, a distortion takes place at the peripheral portion of a scanning region 210 and positional shifts result. Where the original mesh position is indicated by dotted line, a point 301a is shifted by a distance r to a point 301b. This distance is calculated to control the deflector 16 such that the shifted point can recover the original position. In a method for calculation of distance, for example, the movement of specimen stage 12 is controlled such that the specimen 13 can be moved by distance (x1, y1). Subsequently, the deflection position is shifted by distance (x1, y1) by means of the deflector 16. Since the movement of deflection position is effected by the same distance as that of the movement of specimen stage 12, no apparent movement is caused in the absence of distortion. But, in effect, the field of view cannot remain unchanged because a scanning area associated with the point 301a shifts to the point 301b. This inequality is corrected by controlling the scanning position the deflector 16 provides. Correction of the scanning distortion can be made through the use of a method as described in, for example, the aforementioned JP-A-10-318950. The control amount of the deflector necessary for scanning distortion correction is measured in advance and stored in a storage means while bearing relation to the deflection position or deflection angle.

The adjustment may also be made by deflecting only the charged particle beam 36 without resort to movement of the specimen stage 12. With a grid-shaped specimen used, the amount of distortion can be calculated without moving the specimen stage 12 and time to calculate the distortion amount can be reduced by a time to move the specimen stage 12.

Figure 10:
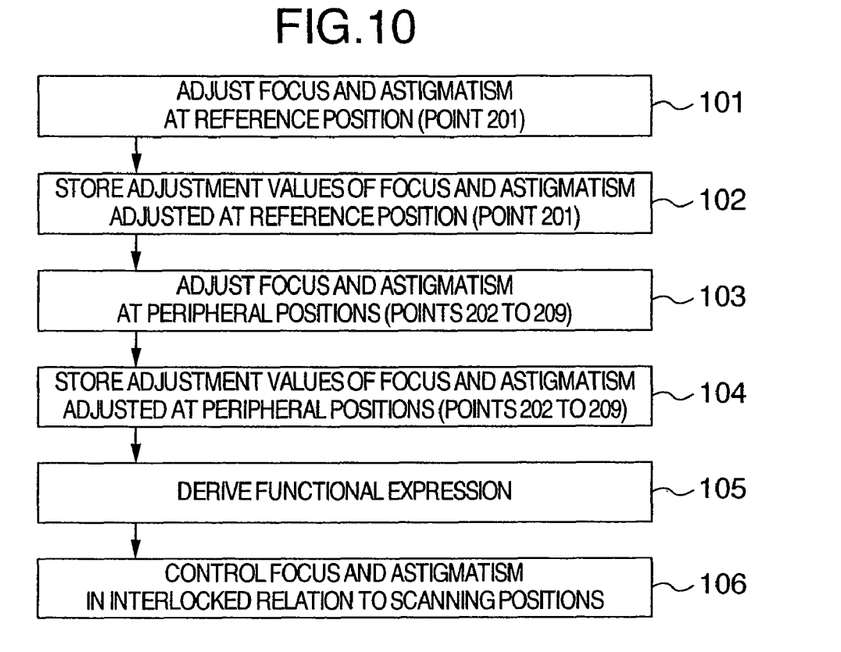
FIG. 10 is a flowchart showing the procedure of focus/astigmatism adjustment.

Turning now to FIG. 10, there is illustrated a flowchart showing the procedure for making adjustment of focus and astigmatism in interlocked relation to the scanning position.

Figure 11:
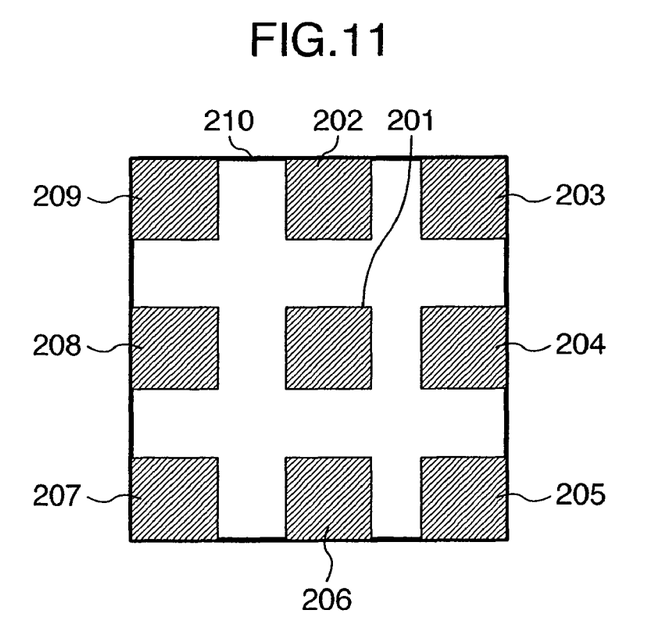
FIG. 11 is a diagram for explaining scanning areas.
Figure 12:
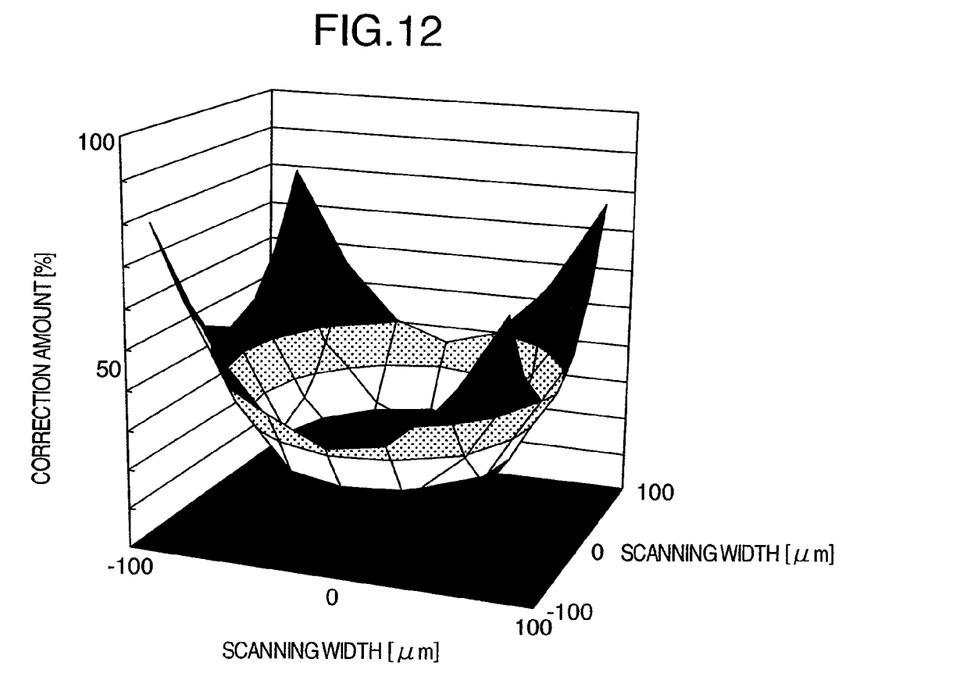
FIG. 12 is a three-dimensional graphical representation showing the relation between scanning width and correction amount.

For example, a scanning region 210 is defined as shown in FIG. 11 and then positions of 8 target points, for instance, are set distantly from a central area inside the scanning region 210, thus providing scanning areas 202 to 209. Focus and astigmatism are adjusted at the central area 201 in step 101 and adjusted values of focus and astigmatism are respectively stored (step 102). In step 103, adjustment of focus and astigmatism is made at each of the scanning areas 202 to 209 and adjusted values of focus and astigmatism for the individual areas are stored (step 104). Assuming that the adjusted values of focus and astigmatism at the central scanning area 201 are 0 (zero), amounts of focus correction when adjustment is made inside, for example, a 100 μm×100 μm field of view are given as illustrated in FIG. 12. The correction value increases toward the edge of the scanning region as the scanning region spreads, indicating that the amount of image field curvature aberration to be corrected increases. These adjustment values are stored in, for example, a memory provided in the controller 31.

In step 105, values of correction to be executed on real time base are derived from the stored adjusted values. Practically, adjusted values of focus and astigmatism at all of the scanning areas are replaced with a function of scanning position (X,Y) of the primary charged particle beam 36 and therefore, a functional expression is derived. At the time that the scanning position of primary charged particle beam 36 is controlled by the scanning signal generator 24 such that the beam is at a scanning position (X1, Y1), correction values of focus and astigmatism at that position are set. As a consequence, focus and astigmatism can be adjusted at all the areas inside the scanning region 210 and blur and astigmatism can be eliminated. As the function to be derived for this purpose, a linear function, a quadratic function or a cubic function can be used. When considering asymmetry, a quadratic or higher function may preferably be used. For example, where a correction functional expression is a function of position (X,Y), a correction function F(X,Y) is as follows:

$$F(X,Y)=aX^2+bY^2+cX+dY+eP$$

where a to e are coefficients.

In making adjustment at the scanning areas 202 to 209, adjustment can be carried out by noticing narrow areas of the individual scanning areas 202-209 of scanning region while scanning the whole of the scanning region 210 by means of the deflector 16 but for improving the accuracy of adjustment, a method may also be employed, according to which an adjustment is conducted at high magnification at the scanning area 201 in the center of the scanning region 210 and thereafter, adjustment is conducted at the peripheral scanning areas 202 to 209 by performing scanning and irradiation at magnifications suitable for these areas.

In deriving the functional expression, if the adjustment is made with the region 210 in FIG. 11 divided into about 5×5=25 points though not illustrated, the correction functional expression can approach more closely to practicability and the accuracy of adjustment can be improved. The wider the region 210, the finer the division of the region into areas for adjustment needs to be. At that time, by deflecting the charged particle beam 36 at positions of the individual scanning areas and at the same time by moving the specimen stage 12 by a distance equal to an amount of movement of charged particle beam 36 to each scanning area, adjustment of focus and astigmatism can be made for a just hit object on the specimen. But, in the case of a specimen liable to be electrified, the amount of electrified charge changes with the dosage of the charged particle beam and therefore, adjusted values at, particularly, the latter half of scanning areas differ from proper adjustment values. In such an event, it is recommended that adjustment be carried out by not moving the specimen stage but moving only the charged particle beam.

According to an exemplified adjustment method, adjustment carried out at the scanning area 201 in the step 101 is such that the focus is adjusted by means of the coil 41 inside the objective lens 9 and the astigmatism is corrected by means of the stigmator 40; and subsequently, in the step 103, the focus is adjusted by means of the coil 42 for correction inside the objective lens 9 and the astigmatism is corrected by means of the stigmator 40.

Figure 13:
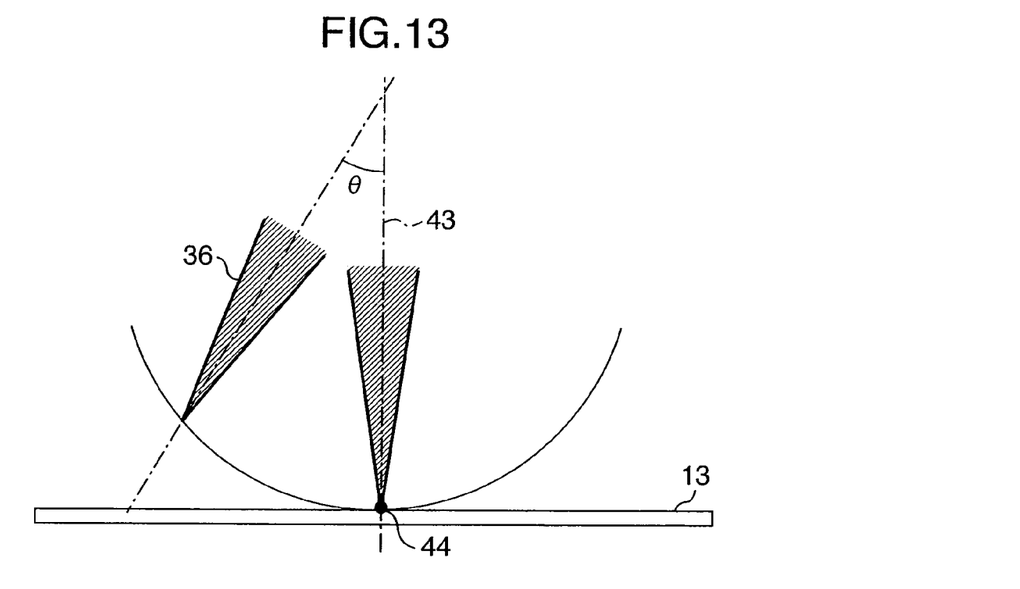
FIG. 13 is a diagram showing an angle a charged particle beam makes to the optical axis.

In the aforementioned adjustment method, adjustment is made in accordance with the scanning position of primary charged particle beam 36 determined by the deflector 16 but as shown in FIG. 13, control can also be done in accordance with an angle θ the primary charged particle beam 36 makes to the center. In this case, the correction functional expression is a function of deflection angle (θ) and a correction function F(θ) can be expressed by the following equation:

$$F(\theta)=a'\theta^2+b'\theta+c'$$

where a' to c' are coefficients.

Figure 14:
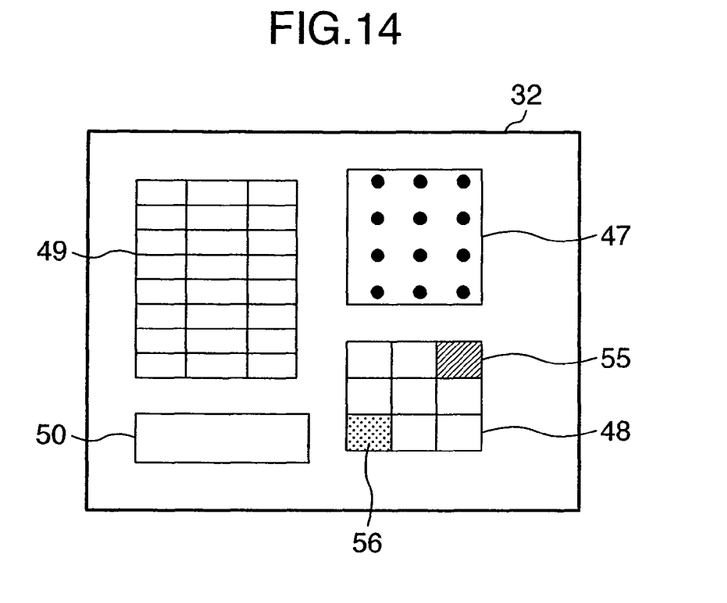
FIG. 14 is a diagram showing an example of a screen display unit.

The aforementioned adjustment may be conducted manually by an adjuster while giving a display on the image display unit 32 but it may be done automatically by means of an image processor 37. In the case of manual adjustment by the adjuster, an image 47 of the specimen is displayed on the image display unit 32 and focus and astigmatism are adjusted while watching the image. Designation as to at which area of the scanning region the adjustment is to be conducted is given by an adjustment position designation button 48. To facilitate distinctive recognition as to which position of the adjustment position designation button 48 an actually adjusted image corresponds to, a method for display of the adjustment position designation button 48 can preferably be changed by, for example, changing color or applying masking as shown at an area 55 in FIG. 14. Further, by changing a method for display of the adjustment position designation button indicative of a position at which adjustment ends in a similar way, distinction from an unadjusted position can be facilitated. Exemplarily, a method for changed display is indicated at an area 56 in FIG. 14.

For confirmation of adjusted values, they can also be displayed on the image display unit 32 by using an adjusted value confirmation table 49. Concurrently therewith, the derived functional expression and coefficients can also be displayed. In case a series of adjustment steps are conducted automatically by means of the image processor 37, it is also possible for the user to confirm the status of adjustment by displaying the adjusted value confirmation table 49. Adjusted values and coefficients of the correction functional expression as shown in FIG. 12 can also be displayed diagrammatically at a display area 50. Besides, the correction functional expression per se can also displayed at the display area 50.

Figure 15:
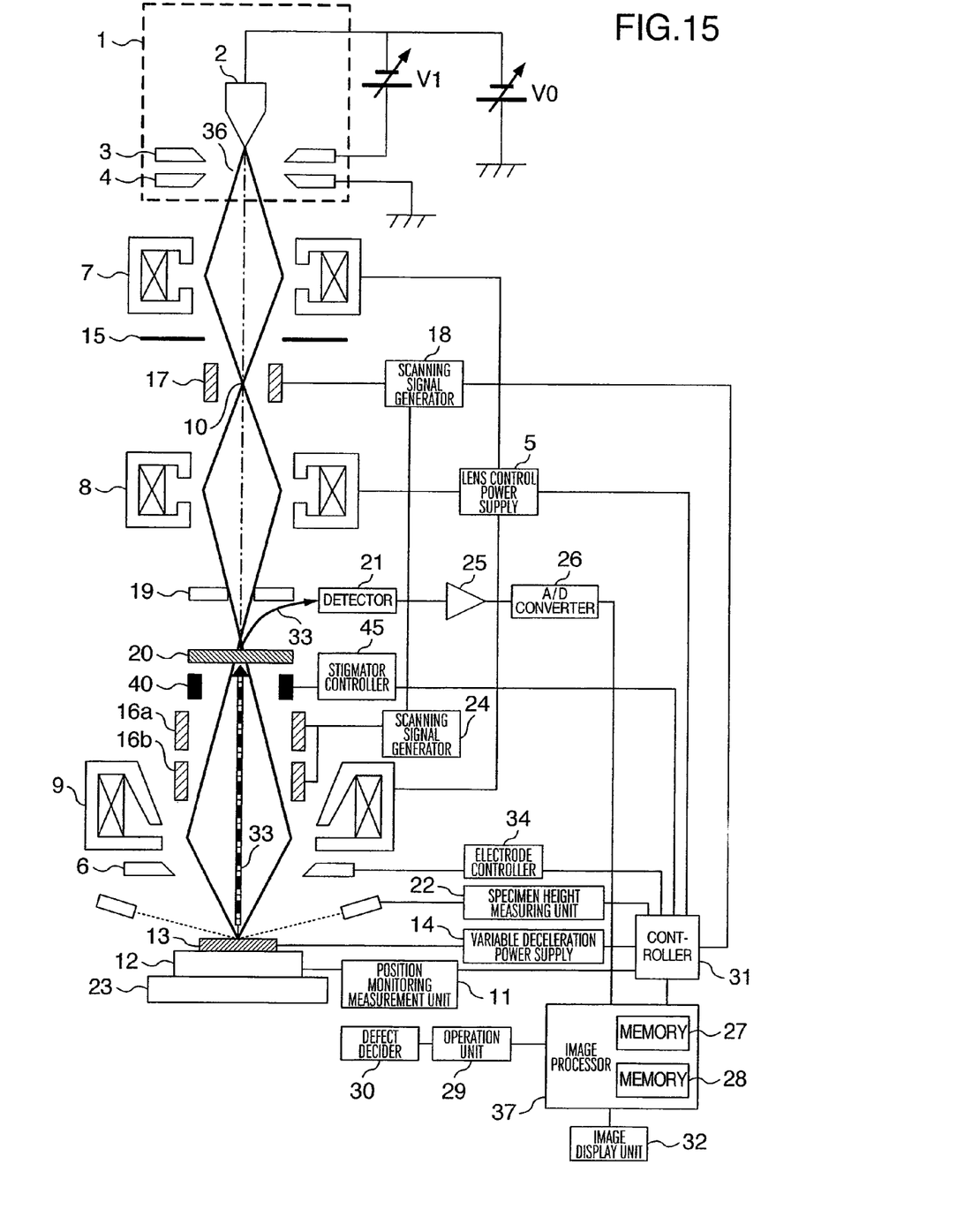
FIG. 15 is a diagram showing an example of schematic construction of an inspection apparatus using an electron beam.

Referring to FIG. 15, an example of an inspection apparatus using an electron beam according to the present invention is constructed as schematically illustrated therein. An electron gun 1 is comprised of an electron source 2, an extracting electrode 3 and an accelerating electrode 4. Extraction voltage V1 is applied across the electron source 2 and the extracting electrode 3 to thereby extract a primary electron beam 36 from the electron source 2. The accelerating electrode 4 is maintained at earth potential and accelerating voltage V0 is applied across the accelerating electrode 4 and the electron source 2. Accordingly, the primary electron beam 36 is accelerated with the accelerating voltage V0. The accelerated primary electron beam 36 is removed of an unnecessary region by means of an aperture 15, condensed by a condenser lens 7 connected to a lens control power supply 5 so as to be formed into a crossover 10 and further condensed by a condenser lens 8. Then, the condensed primary electron beam is focused by an objective lens 9 on a specimen 13 such as a semiconductor wafer held on a specimen stage 12. The specimen stage 12 is movable at least in the horizontal direction by means of a stage drive unit 23 and a measurement unit for position monitoring 11. Designated by reference numeral 17 is a blanking deflector controlled by a scanning signal generator 18.

The specimen 13 is irradiated with the focused primary electron beam 36. The primary electron beam 36 is corrected for its astigmatic aberration with a stigmator 40 adapted to correct the astigmatism by applying an electric field or a magnetic field and is scanned by a deflector generally designated at 16 and having elements 16a and 16b connected to a scanning signal generator 24. The scanning position of primary electron beam 36 is controlled with the scanning signal generator 24. Disposed more closely to the specimen 13 than to the objective lens 9 is an electrode 6 for controlling electricity charging potential on the specimen 13. As a retarding voltage for decelerating the primary electron beam 36, a negative voltage is applied to the specimen 13 by means of a variable deceleration power supply 14. The retarding voltage can be changed arbitrarily by adjusting the variable deceleration power supply 14. Although not illustrated, the above components are housed in a vacuum container suitable for illumination of the electron beam.

The height of the specimen 13 is measured on real time base by means of a specimen height measuring unit 22 and measurement results are fed back from a controller 31 to the lens control power supply 5 so that the focus of objective lens 9 may be corrected dynamically. In addition, the irradiation position of the primary electron beam 36 is detected with the position monitoring measurement unit 11 and measurement results are fed back from the controller 31 to the scanning signal generator 24 so that the irradiation position of primary electron beam 36 may be controlled.

When the focused primary electron beam 36 irradiates the specimen 13 while being scanned by means of the deflector elements 16a and 16b, an information signal 33 indicative of secondary electrons and reflected electrons is generated from the specimen 13. The retarding voltage affecting the primary electron beam 36 irradiating the specimen 13 acts as an accelerating voltage applied to the generated information signal 33, thereby ensuring that the information signal 33 can be transported to above the objective lens 9 (on the side of the electron gun). Disposed above the objective lens is an orthogonal electromagnetic field generator 20 for generating orthogonal electromagnetic fields and intensities of electric field and magnetic field of the respective electromagnetic fields are controlled such that the deflection effects acting on the primary electron beam 36 can be cancelled with each other whereas the deflection effect can be applied on the information signal 33 transported to above the objective lens 9 in such a way that the information signal can be directed directly to a detector 21 or can be impinged or irradiated on a conversion electrode 19. The electrode 19 is formed of a material from which secondary information signal electrons are generated under the impingement of the information signal 33 in accordance with the amounts of impinged signal electrons, though not illustrated. The secondary information electrons generated from the electrode 19 are also detected by the detector 21 and converted into an electric signal.

The electric signal indicative of the information signal 33 detected by the detector 21 is amplified with an amplifier circuit 25 and digitized by an A/D converter 26. The digitized signal is stored as an image signal in memories 27 and 28 of image processor 37. Specifically, an image signal indicative of an information signal 33 of a first inspection area is stored in the memory 27. Subsequently, an image signal indicative of an information signal 33 of a second inspection area, adjoining the first inspection area, of the same circuit pattern is stored in the memory 28 concurrently with comparison with the secondary electron image signal of the first inspection area in the memory 27. Further, an image signal indicative of an information signal 33 of a third inspection area is overwritten on the memory 27 and at the same time, compared with that of the second inspection area stored in the memory 28. By repeating these operations, storage and comparison of image signals of all inspection areas are executed. It is to be noted that the image signals stored in the memories 27 and 28 can be displayed on a monitor or image display unit 32.

Image comparison is conducted in an operation unit 29 and a defect decider 30. More specifically, in respect of the image signals indicative of the information signals 33 stored in the memories 27 and 28, various statistics specified by such statistics as mean value and variance of image density values, values of difference among peripheral pixels, [Rangeless statistics value] and ["kyohki" matrix] are calculated. After execution of these processes has been completed, image signals applied with the processes are transferred to the defect decider 30 and compared with one another to extract difference signals so that they may be separated into defect signals and other signals by consulting a defect decision condition which has already been determined and stored.

Further, an image signal indicative of an information signal 33 of an inspection area of a standardized circuit pattern may be stored in the memory 27 in advance and an image signal indicative of an information signal 33 of an inspection area of a circuit pattern of the specimen 13 may be stored in the memory 28 concurrently with comparison with the image signal stored in the memory 27.

In the construction as above, individual ones of the adjusted values of focus and astigmatism can be replaced with a function of scanning position (X,Y) of the beam in accordance the flowchart of FIG. 10 and the scanning region division diagram of FIG. 11. When the scanning position of the primary electron beam 36 is controlled or the beam is at a scanning position (X1,Y1) under the control of the scanning signal generator 24, correction values of focus and astigmatism at that position can be set on the basis of the functional expression. Accordingly, the focus and astigmatism can be adjusted at all areas inside the scanning region 210 and blur and astigmatism can be eliminated.

Figure 16:
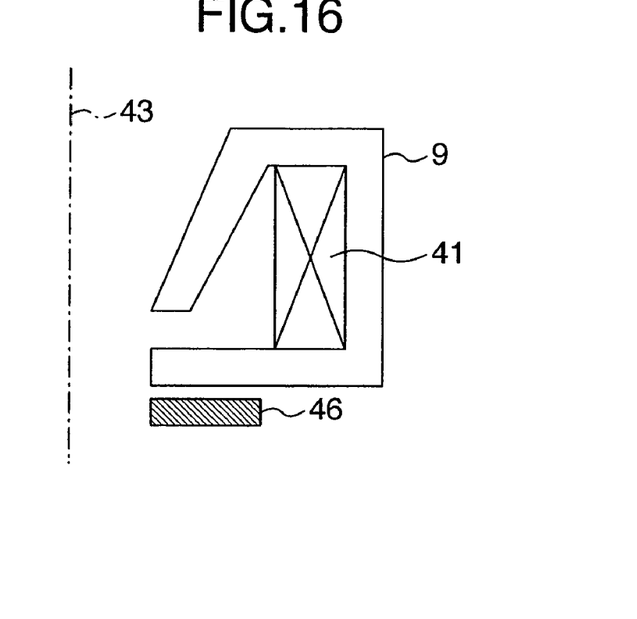
FIG. 16 is a diagram showing an example of structure of an objective lens.

In order to improve the throughput as in the case of the inspection apparatus, a method is available in which the primary electron beam 36 is scanned at a high speed. In this case, the deflector may be of the electrostatic type for performing control by applying voltage to the electrode in consideration of its response rate. Since in this case the focus and astigmatism are adjusted on real time base in interlocked relation to the scanning position while scanning the primary electron beam 36 by means of the deflector elements 16a and 16b controlled by the scanning signal generator 24, a mechanism for correction of the focus may preferably have, from the standpoint of the response rate, a structure as shown in FIG. 16 in which an objective lens 9 comprised of a coil 41 is used in combination with a focus correction electrode 46. For example, in the flowchart for adjustment shown in FIG. 10, the exciting current of the coil 41 inside the objective lens 9 is controlled for focus adjustment and the stigmator 40 is used for adjustment of astigmatism at the central area 201 in the step 101. Next, in the step 103, the electrostatic type stigmator electrode as shown in FIG. 5 may preferably be used for adjustment in consideration of the response rate. In the adjustment of focal position, the coil 41, as provided in the FIG. 16 structure, is used for adjustment at the central area 201 in the step 101 and the focus correction electrode 46 is used in the step 103.

Figure 17:
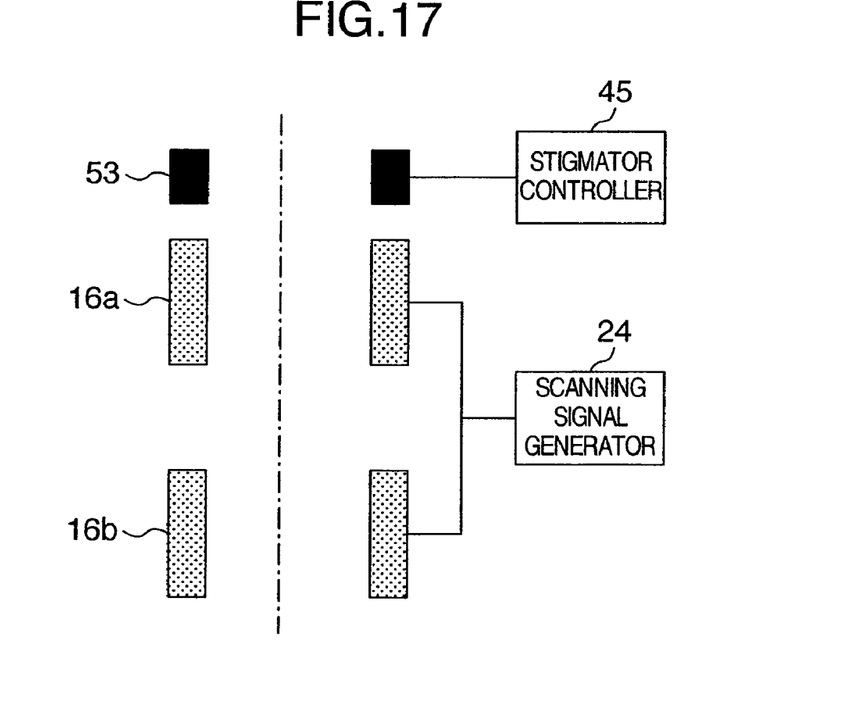
FIG. 17 is a diagram showing an example of a deflector and a stigmator electrode of the electrostatic type used in combination.
Figure 18:
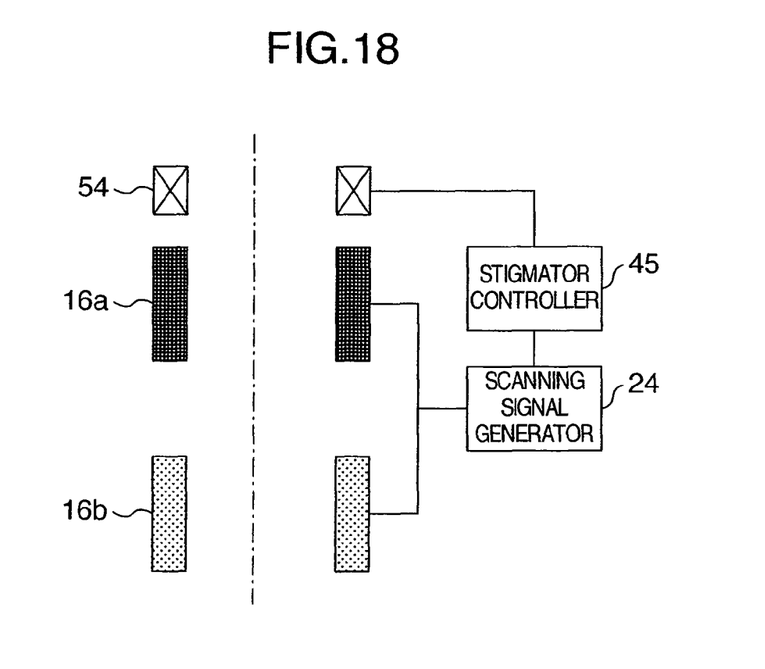
FIG. 18 is a diagram showing an example where a deflector includes the same type of electrode as a stigmator of the electrostatic type.

Referring to FIG. 17, the deflector 16 is combined with the electrostatic type stigmator electrode 53 as exemplified therein. In case the deflector 16 is of the electrostatic type so as to be structured similarly to the stigmator electrode 53, respective control voltages may be superimposed on each other to perform control as shown in FIG. 18. In the example of FIG. 18, the deflector 16 has two stages but the control voltage for astigmatism correction may be superimposed on either the element 16a or 16b. The control voltage for astigmatism correction may be superimposed on each of the elements 16a and 16b to realize proper use. Further, as shown in FIG. 18, a stigmator coil 54 other than that for control on real time base may be provided for the sake of control.

Operation commands and condition setting are applied to the above individual components of inspection apparatus by means of the controller 31. Accordingly, such conditions as accelerating voltage, deflection width (scanning width) and deflection speed (scanning speed) of the electron beam, moving speed of the specimen stage and timing for the detector to fetch output signals are inputted in advance to the controller 31.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A scanning electron microscope for obtaining an image of a scanned region of a specimen by a primary electron beam, comprising:
   an electron optical system including an electron gun for emitting the primary electron beam, an objective lens for converging the primary electron beam and generating a focal point on the specimen, and a deflector for scanning the primary electron beam on a scanning region of the specimen;
   a focus adjustment means for adjusting a focal position of the primary electron beam by controlling said objective lens;
   a stigmator for adjusting an astigmatic aberration of the primary electron beam;
   a memory means for storing a relation between either an astigmatism adjusting value used by said stigmator or a focus adjustment value used by said focus adjustment means, and either a deflection position or a deflection angle of the primary electron beam by said deflector;
   a controller for controlling said stigmator, said deflector and said focus adjustment means,
   wherein said controller controls said focus adjustment means so that the primary electron beam is focused on the specimen in accordance with said relation and in interlocked relation to the scanning position of the primary electron beam, or controls said stigmator so that the astigmatic aberration of the primary electron beam is corrected in accordance with said relation and in interlocked relation to the scanning position of the primary electron beam; and
   a focus correction electrode for adjusting the focal position of the primary electron beam;
   wherein said scanning region is divided into a plurality of areas, and adjustment values for adjusting said focal position to each of the areas or adjustment values for correcting said astigmatic aberration beam to each of the areas are stored in said memory means in correspondence with positions of said divided areas in the scanning region, and
   wherein the adjustment value to a divided area including a center of the scanning region is determined by using the focus adjustment means, while the adjustment values to the other divided areas of the scanning region are determined by using the focus correction electrode.

2. The scanning electron microscope according to claim 1, wherein said deflector is an electromagnetic type deflector, and
   said controller controls a value of a current for supplying to said electromagnetic type deflector.

3. The scanning electron microscope according to claim 1, wherein said deflector is an electrostatic type deflector, and
   said controller controls a value of a voltage applied to said electrostatic type deflector.

4. The scanning electron microscope according to claim 1, wherein said adjustment values are stored as a functional expression of the deflection position or the deflection angle of said primary electron beam.

5. The scanning electron microscope according to claim 1, further comprising: display means for displaying said image by using an output of a detector.

6. The scanning electron microscope according to claim 1, wherein said stigmator is an electrostatic type stigmator.

7. The scanning electron microscope according to claim 1, wherein said stigmator controls a stigmator coil.

8. An inspection apparatus utilizing a scanning electron microscope for obtaining an image of predetermined scanning region, said scanning electron microscope further comprising:
- an electron optical system including an electron gun for emitting the primary electron beam, an objective lens for converging the primary electron beam and generating a focal point on the specimen, and a deflector for scanning the primary electron beam on a scanning region of the specimen;
- a focus adjustment means for adjusting a focal position of the primary electron beam by controlling said objective lens;
- a stigmator for adjusting an astigmatic aberration of the primary electron beam;
- a memory means for storing a relation between either an astigmatism adjusting value used by said stigmator or a focus adjustment value used by said focus adjustment means, and either a deflection position or a deflection angle of the electron beam by said deflector; and
- a controller for controlling said stigmator, said deflector and said focus adjustment means,
- wherein said controller controls said focus adjustment means so that the primary electron beam is focused on the specimen in accordance with said relation and in interlocked relation to the scanning position of the primary electron beam or controls said stigmator so that the astigmatic aberration of the primary electron beam is corrected in accordance with said relation and in interlocked relation to the scanning position of the primary electron beam; and
- a focus correction electrode for adjusting the focal position of the primary electron beam;
- wherein said scanning region is divided into a plurality of areas, and adjustment values for adjusting said focal position to each of the areas or adjustment values for correcting said astigmatic aberration beam to each of the areas are stored in said memory means in correspondence with positions of said divided areas in the scanning region, and
- wherein the adjustment value to a divided area including a center of the scanning region is determined by using the focus adjustment means, while the adjustment values to the other divided areas of the scanning region are determined by using the focus correction electrode.

* * * * *